(12) United States Patent
Hong et al.

(10) Patent No.: US 11,534,772 B2
(45) Date of Patent: Dec. 27, 2022

(54) TRAP DEVICE FOR POWDER COATING APPARATUS

(71) Applicants: HYUNDAI MOTOR COMPANY, Seoul (KR); KIA MOTORS CORPORATION, Seoul (KR); ISAC RESEARCH INC., Daejeon (KR)

(72) Inventors: Woong Pyo Hong, Hwaseong-si (KR); Jung Yeon Park, Hwaseong-si (KR); Chae Woong Kim, Daejeon (KR); Hyun Seok Cha, Daejeon (KR); Hyung Sang Park, Seoul (KR)

(73) Assignees: HYUNDAI MOTOR COMPANY, Seoul (KR); KIA MOTORS CORPORATION, Seoul (KR); ISAC RESEARCH INC., Daejeon (KR)

(*) Notice: Subject to any disclaimer, the term of this patent is extended or adjusted under 35 U.S.C. 154(b) by 362 days.

(21) Appl. No.: 16/850,611

(22) Filed: Apr. 16, 2020

(65) Prior Publication Data
US 2021/0162428 A1 Jun. 3, 2021

(30) Foreign Application Priority Data

Dec. 3, 2019 (KR) .......................... 10-2019-0159178

(51) Int. Cl.
*B03C 3/82* (2006.01)
*B03C 3/36* (2006.01)
*C23C 16/44* (2006.01)

(52) U.S. Cl.
CPC .................. *B03C 3/82* (2013.01); *B03C 3/36* (2013.01); *C23C 16/4401* (2013.01); *C23C 16/4412* (2013.01); *B03C 2201/22* (2013.01)

(58) Field of Classification Search
CPC ............ C23C 16/4412; C23C 16/4401; C23C 16/4417; B03C 3/366; B03C 3/019; B03C 1/0105; B03C 3/82; B03C 3/36; B03C 2201/22; B03C 1/0332; B03C 1/0335; B03C 1/30
See application file for complete search history.

(56) References Cited

U.S. PATENT DOCUMENTS

| 2,874,839 A | * | 2/1959 | Rogers, Jr. ................. B03C 1/30 |
| | | | 55/459.1 |
| 4,116,829 A | * | 9/1978 | Clark ...................... C02F 1/488 |
| | | | 210/695 |
| 6,099,649 A | | 8/2000 | Schmitt et al. |
| (Continued) | | | |

FOREIGN PATENT DOCUMENTS

| CN | 108067412 A | * | 5/2018 | |
| CN | 108580288 A | * | 9/2018 | ............... B03C 1/02 |
| (Continued) | | | | |

*Primary Examiner* — Patrick H Mackey
(74) *Attorney, Agent, or Firm* — McDonnell Boehnen Hulbert & Berghoff LLP

(57) ABSTRACT

The present disclosure relates to a trap device for a powder coating apparatus. The trap device includes a body part including an inlet through which exhaust gas containing lost powder is introduced, an outlet through which the exhaust gas is discharged, and an interior space in communication with the inlet and the outlet and a trap part that is located in the interior space of the body part and that traps the lost powder contained in the exhaust gas by a magnetic force.

16 Claims, 17 Drawing Sheets

(56) References Cited

U.S. PATENT DOCUMENTS 6,402,806 B1     6/2002   Schmitt et al.
8,894,745 B2 *   11/2014   Dunn ........................ B03C 3/47
                                                                                        95/79

FOREIGN PATENT DOCUMENTS

| CN | 210230421 U | * | 4/2020 |
| CN | 214864361 U | * | 11/2021 |
| KR | 2001-0033505 A | | 4/2001 |
| KR | 10-1188024 B1 | | 10/2012 |

* cited by examiner 111 112

111a 112a

TRAP DEVICE FOR POWDER COATING APPARATUS

CROSS-REFERENCE TO RELATED APPLICATION

This application claims the benefit of priority to Korean Patent Application No. 10-2019-0159178, filed in the Korean Intellectual Property Office on Dec. 3, 2019, the entire contents of which are incorporated herein by reference.

TECHNICAL FIELD

The present disclosure relates to a trap device for a powder coating apparatus.

BACKGROUND

Atomic layer deposition (ALD) is a vacuum process that is applied to various fields such as semiconductor devices, MEMS/NEMS, displays, and the like. The ALD having good step coverage may be used in a process of coating fine nanometer-sized powder particles. The powder, together with exhaust gas, may be lost in a process of discharging the exhaust gas from a powder coating chamber to the outside through an exhaust device.

In the case where the lost powder is introduced into a pump connected to the exterior of the chamber, the powder may be accumulated in the pump. The accumulation of the powder may cause damage to the pump and may reduce the life-time of the pump, and it is difficult to remove the powder accumulated in the pump.

Accordingly, a trap device is used to block the lost powder before the lost powder is introduced into the pump. The prior art discloses a device that condenses powder and exhaust gas lost in a deposition process, by cooling the powder and the exhaust gas to a low temperature using a cold trap. However, the prior art has problems in that a configuration of a device used for cooling is complicated, and it is not easy to remove powder trapped in a trap part. Due to these problems, it is difficult to apply the device of the prior art to a process.

SUMMARY

The present disclosure has been made to solve the above-mentioned problems occurring in the prior art while advantages achieved by the prior art are maintained intact.

An aspect of the present disclosure provides a trap device that traps fine powder particles lost from a powder coating chamber by a magnetic force, thereby blocking magnetic powder before the magnetic powder is introduced into a pump, which in turn prevents damage to the pump, increases the life-time of the pump, and maintains the performance of the pump to reduce repair costs.

Another aspect of the present disclosure provides a trap device with a simple structure for reducing manufacturing costs and easily removing accumulated powder.

The technical problems to be solved by the present disclosure are not limited to the aforementioned problems, and any other technical problems not mentioned herein will be clearly understood from the following description by those skilled in the art to which the present disclosure pertains.

According to an aspect of the present disclosure, a trap device for a powder coating apparatus includes a body part including an inlet through which exhaust gas containing lost powder is introduced, an outlet through which the exhaust gas is discharged, and an interior space in communication with the inlet and the outlet and a trap part that is located in the interior space of the body part and that traps the lost powder contained in the exhaust gas by a magnetic force.

According to an embodiment, the trap part may include a first trap part that is disposed adjacent to the inlet and that traps the lost powder contained in the exhaust gas, which is introduced through the inlet, by a magnetic force and a second trap part that is disposed adjacent to the outlet and that traps the lost powder contained in the exhaust gas, which is to be discharged through the outlet, by a magnetic force.

According to an embodiment, the trap part may further include a first partition wall that is disposed between the first trap part and the second trap part and that guides the exhaust gas, which is introduced through the inlet, in a direction away from the outlet.

According to an embodiment, the first partition wall may have a cross-section in an arc shape that is open in the direction in which the exhaust gas is guided, and the first partition wall may extend in a direction corresponding to an extension direction of the first trap part and may be disposed to surround the first trap part.

According to an embodiment, the first partition wall may extend to an upper inner wall of the body part in which the inlet is formed and may be disposed to surround the inlet.

According to an embodiment, the trap part may further include a second partition wall that is disposed between the first partition wall and the second trap part and that guides the exhaust gas toward the outlet.

According to an embodiment, the second partition wall may have a cross-section in an arc shape that is open in an opposite direction to a direction in which the first partition wall is open, and the second partition wall may extend in a direction corresponding to an extension direction of the second trap part and may be disposed to surround the second trap part.

According to an embodiment, the trap part may include a first trap part that is disposed adjacent to the inlet and that traps the lost powder contained in the exhaust gas, which is introduced through the inlet, by a magnetic force and a first partition wall that is disposed to surround the first trap part and that is open in a direction toward the inlet and in a direction away from the outlet.

According to an embodiment, the trap part may include a trap column that extends in a predetermined direction and a trap wing that extends in a direction away from the trap column and that is coupled to the trap column, and at least one of the trap column and the trap wing may trap the lost powder by a magnetic force.

According to an embodiment, when a direction in which the exhaust gas is introduced into the interior space of the body part through the inlet is referred to as a reference direction, the trap part may extend in the reference direction, and a distal end of the trap part in an opposite direction to the reference direction may face toward the inlet.

According to an embodiment, when a direction in which the exhaust gas is introduced into the interior space of the body part through the inlet is referred to as a reference direction, the trap part may extend in a direction perpendicular to the reference direction and may be disposed to overlap a projection area when the inlet is projected in the reference direction.

According to an embodiment, an isolation valve that opens and closes the outlet may be connected to the outlet.

According to an embodiment, the trap device may further include a cooling part that cools an inner sidewall of the body part to condense and trap, on the inner sidewall, non-magnetic lost powder contained in the lost powder.

According to an embodiment, the body part may include a main body extending in a predetermined direction and having the interior space that is open at opposite ends, a first cover coupled to the main body to cover one opening of the main body, and a second cover coupled to the main body to cover an opposite opening of the main body.

According to an embodiment, the inlet and the outlet may be formed in the first cover, and the trap part extending toward the first cover may be disposed on the second cover.

According to an embodiment, the trap part may include a first trap part that is disposed on the first cover and that extends toward the second cover, in which the first trap part traps the lost powder contained in the exhaust gas, which is introduced through the inlet, by a magnetic force and a second trap part that is disposed on the second cover and that extends toward the first cover, in which the second trap part traps the lost powder contained in the exhaust gas, which is to be discharged through the outlet, by a magnetic force. The inlet and the outlet may be formed in the main body such that the inlet and the outlet are in communication with the interior space in a direction perpendicular to an extension direction of the interior space and are adjacent to the first trap part and the second trap part.

According to an embodiment, the first cover may be coupled with the main body by a clamp.

According to an embodiment, the first trap part may be fixed to the first cover and may be separated from or coupled to the main body together with the first cover when the first cover is separated from or coupled to the main body.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
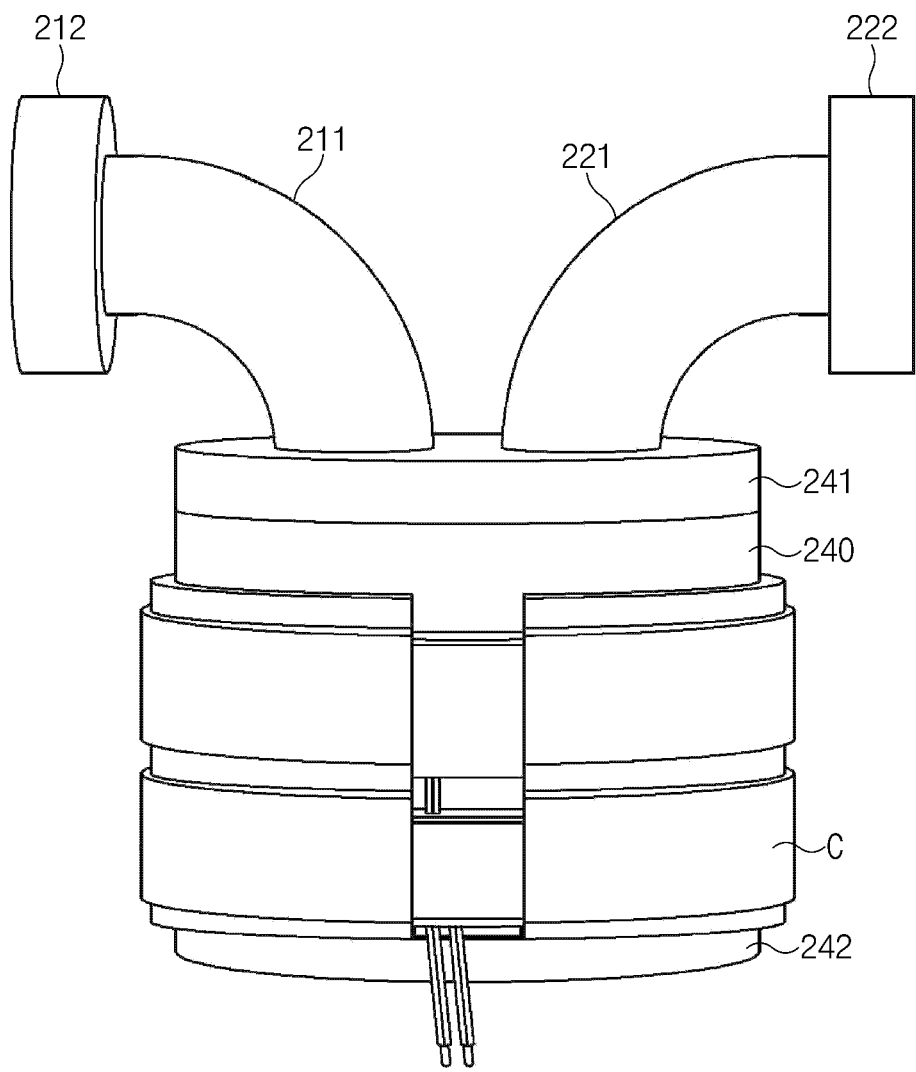
FIG. 1 is a perspective view illustrating a trap device for a powder coating apparatus according to embodiment 1 of the present disclosure.

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiment of the present disclosure, a detailed description of well-known features or functions will be ruled out in order not to unnecessarily obscure the gist of the present disclosure.

Embodiment 1

Figure 2:
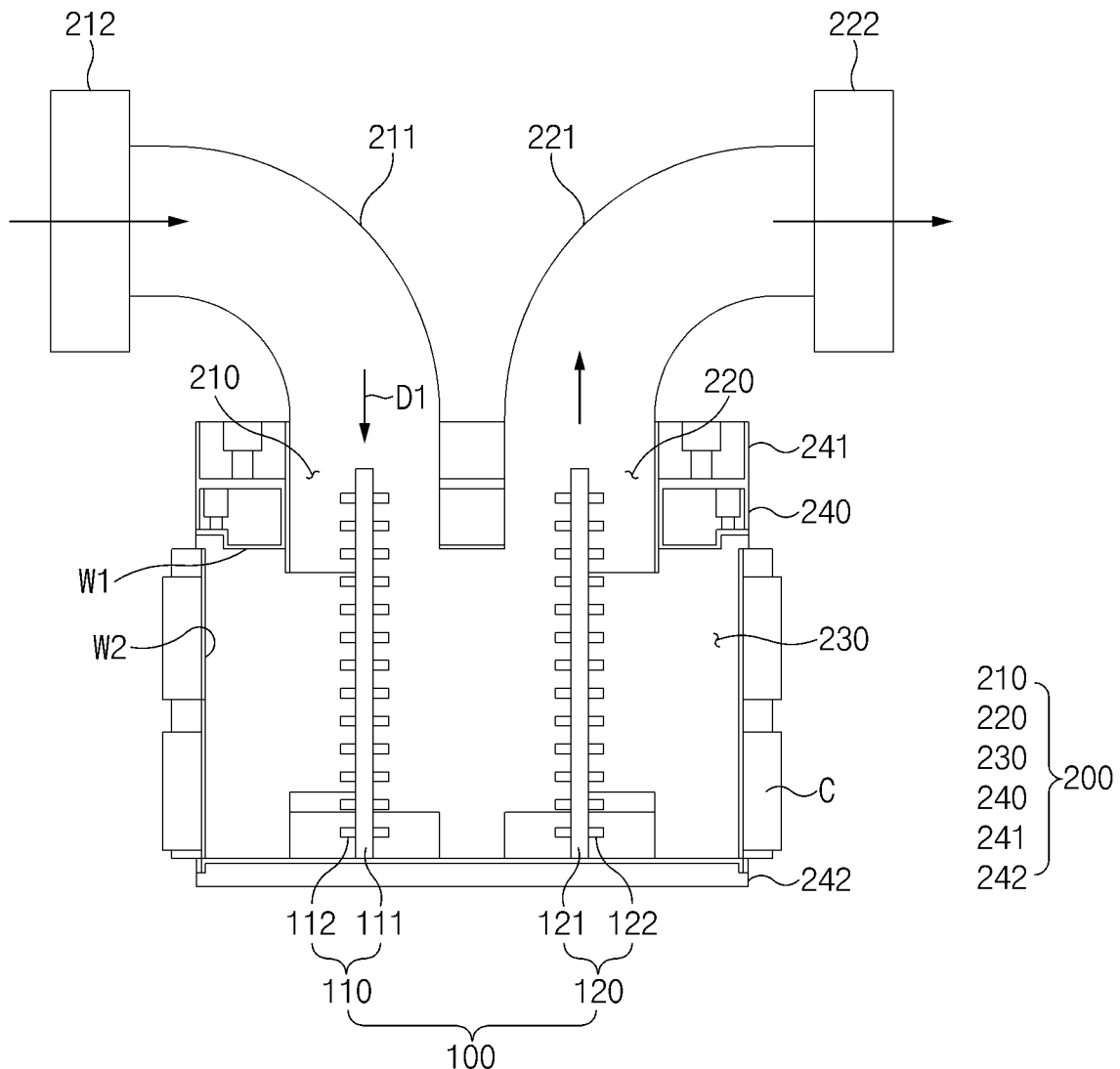
FIG. 2 is a sectional view illustrating the trap device for the powder coating apparatus of FIG. 1.
Figure 3:
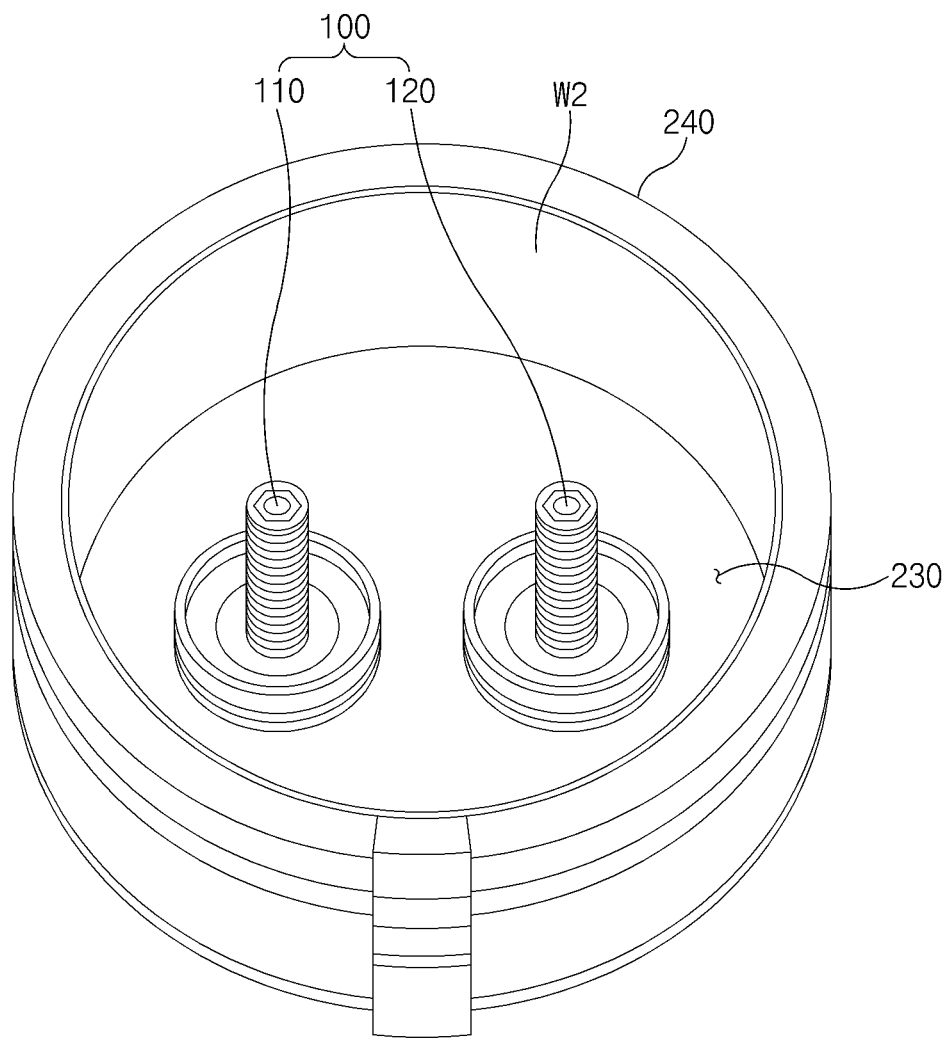
FIG. 3 is a perspective view illustrating the inside of the trap device for the powder coating apparatus of FIG. 1.

A trap device according to embodiment 1 of the present disclosure relates to a trap device for a powder coating apparatus. FIG. 1 is a perspective view illustrating the trap device for the powder coating apparatus according to embodiment 1 of the present disclosure. FIG. 2 is a sectional view illustrating the trap device for the powder coating apparatus of FIG. 1. FIG. 3 is a perspective view illustrating the inside of the trap device for the powder coating apparatus of FIG. 1. As illustrated in FIGS. 1 to 3, the trap device according to embodiment 1 of the present disclosure includes a body part 200 and a trap part 100.

As illustrated in FIG. 2, the body part 200 may include an inlet 210, an outlet 220, and an interior space 230 in communication with the inlet 210 and the outlet 220. The inlet 210 may allow exhaust gas containing lost powder to flow in, and the outlet 220 may allow the exhaust gas to flow out. The inlet 210 and the outlet 220 may be connected with an inlet connecting conduit 211 and an outlet connecting conduit 221, respectively. The inlet connecting conduit 211 and the outlet connecting conduit 221 may have a curved shape as illustrated in FIG. 1, or may have a straight line shape, a broken line shape, or a combination thereof. The inlet connecting conduit 211 and the outlet connecting conduit 221 may have fastening parts 212 and 222 to which other conduits are fastened, respectively. The fastening parts 212 and 222 may be flanges. Due to the shapes of the inlet connecting conduit 211 and the outlet connecting conduit 221, the inlet connecting conduit 211 and the outlet connecting conduit 221 are able to be coupled to various forms of conduits. The interior space 230 may be in communication with the outside through the inlet 210 and the outlet 220.

As illustrated in FIGS. 2 and 3, the trap part 100 may be located in the interior space 230 of the body part 200 and may trap the lost powder contained in the exhaust gas by a magnetic force. For example, the trap part 100 may be formed of a magnetic material. Alternatively, the trap part 100 may be a column having a magnet inside, or may be an electromagnet. The trap part 100 may trap magnetic lost powder contained in the exhaust gas by a magnetic force, thereby preventing the lost powder from being accumulated in a pump.

For example, the exhaust gas containing the lost powder released from a chamber may be introduced through the inlet 120 and guided into the interior space 230 of the body part 200 and may pass the trap part 100 located in the interior space 230. In this case, magnetic lost powder of the lost powder may be trapped on the trap part 100 by a magnetic attraction force between the trap part 100 and the magnetic lost powder.

In the related art, lost powder is trapped by using a method of condensing powder and exhaust gas lost in a deposition process by cooling the powder and the exhaust gas to a low temperature using a cold trap. In contrast, because the trap device of this embodiment uses a magnetic force, the trap device of this embodiment may be manufactured in a simple structure and may have a low risk of failure or defect. Furthermore, because the structure of the trap part 100 is not complicated, the trap part 100 may be manufactured so as to be easily separated from the body part 200. Accordingly, it is easy to separate the trap part 100 from the body part 200 and remove the lost powder trapped on the trap part 100.

As illustrated in FIG. 2, the trap part 100 may include a first trap part 110 and a second trap part 120. The first trap part 110 may be disposed adjacent to the inlet 210 and may trap the lost powder contained in the exhaust gas, which is introduced through the inlet 210, by a magnetic force. The second trap part 120 may be disposed adjacent to the outlet 220 and may trap the lost powder contained in the exhaust gas, which is to be discharged through the outlet 220, by a magnetic force. For example, the exhaust gas containing the lost powder, which is introduced through the inlet 210, may be primarily trapped by the first trap part 110 disposed adjacent to the inlet 210. Thereafter, before discharged through the outlet 220, the exhaust gas may be secondarily trapped by the second trap part 120 disposed adjacent to the outlet 220. As the two trap parts 110 and 120 disposed in the interior space 230 perform the primary and secondary trapping processes, an effect of trapping the lost powder by the trap part 100 may be further increased.

Figure 4:
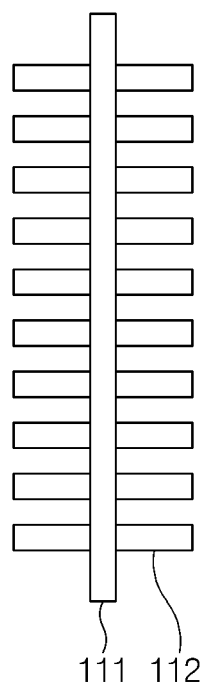
FIG. 4 is a sectional view illustrating a trap part of the trap device for the powder coating apparatus according to embodiment 1 of the present disclosure.

As illustrated in FIG. 4, the trap part 100 may include a trap column 111 and a trap wing 112. The trap column 111 may extend in a predetermined direction. The trap wing 112 may extend in a direction away from the trap column 111 and may be coupled to the trap column 111. At least one of the trap column 111 and the trap wing 112 may trap the lost powder by a magnetic force.

The trap part 100 may be formed to have a large surface area. FIG. 4 is a sectional view illustrating the trap part of the trap device for the powder coating apparatus according to embodiment 1 of the present disclosure. As illustrated in FIG. 4, the trap column 111 may be a column in the form of a straight line. As illustrated in FIG. 4, the trap wing 112 may include a plurality of trap wings and may have a circular cylinder shape with the trap column 111 as the axis. This shape may increase the surface area of the trap part 100, and due to the increased surface area, the area by which the exhaust gas makes contact with the trap part 100 may be increased. Thus, efficiency in trapping the lost powder by the trap part 100 may be increased.

Figure 5:
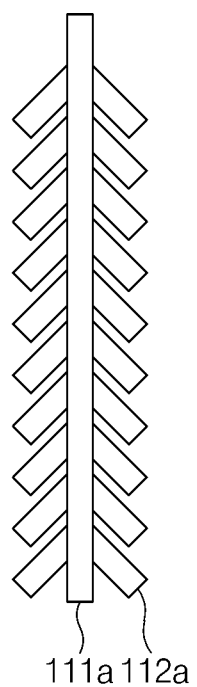
FIG. 5 is a sectional view illustrating a first modified example of the trap part of FIG. 4.
Figure 6:
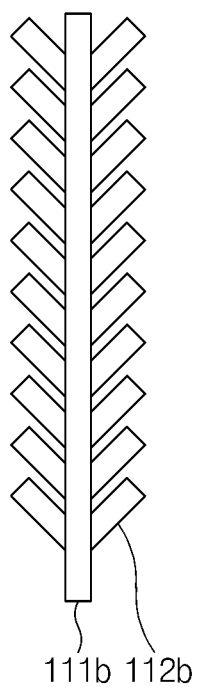
FIG. 6 is a sectional view illustrating a second modified example of the trap part of FIG. 4.
Figure 7:
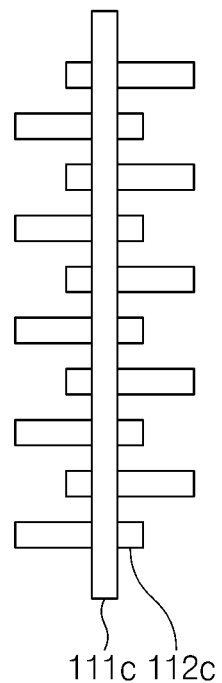
FIG. 7 is a sectional view illustrating a third modified example of the trap part of FIG. 4.

The trap wing of this embodiment may be modified as illustrated in FIGS. 5 to 7. FIG. 5 is a sectional view illustrating a first modified example of the trap wing. As illustrated in FIG. 5, a plurality of trap wings 112a may be provided on a trap column 111a. The trap wings 112a may extend in a lower right direction and a lower left direction with respect to FIG. 5.

FIG. 6 is a sectional view illustrating a second modified example of the trap wing. As illustrated in FIG. 6, a plurality of trap wings 112b may be provided on a trap column 111b. The trap wings 112b may extend in an upper right direction and an upper left direction with respect to FIG. 6.

FIG. 7 is a sectional view illustrating a third modified example of the trap wing. As illustrated in FIG. 7, a plurality of trap wings 112c may be provided on a trap column 111c. The trap wings 112c may have a circular cylindrical shape, and a trap column 111c may pass through one side of each of the trap wings 112c. However, these modified examples are merely illustrative, and modified examples are not limited thereto. Various modified examples for increasing the surface area of the trap part 100 may be present.

The trap device for the powder coating apparatus may be configured such that the trap part 100 extends in a reference direction D1, which will be described below, and a distal end of the trap part 100 in the opposite direction to the reference direction D1 (refer to FIG. 2) faces toward the inlet 210. The reference direction D1 may be a direction in which the exhaust gas is introduced into the interior space 230 of the body part 200 through the inlet 210. For example, as illustrated in FIG. 2, the distal end of the first trap part 110 may face the opposite direction to the reference direction D1 with respect to FIG. 2. Because the distal end of the trap part 100 in the opposite direction to the reference direction D1 faces toward the inlet 210, the exhaust gas introduced through the inlet 210 may easily meet the trap part 100. Accordingly, the amount of the exhaust gas making contact with the trap part 100 may be increased, and thus efficiency in trapping the lost powder by the trap part 100 may be increased.

As illustrated in FIG. 1, the trap device for the powder coating apparatus may further include a cooling part C. The cooling part C may cool an inner sidewall W2 of the body part 200 to condense and trap, on the inner sidewall W2, non-magnetic lost powder of the lost powder. The cooling part C may be a thermoelectric element, or may be a conduit through which a coolant passes. When the temperature of the inner sidewall W2 of the body part 200 is decreased by the cooling part C, gaseous materials contained in the exhaust gas introduced through the inlet 210 may be condensed. At this time, the condensed materials may be coagulated together with the lost powder. Accordingly, the non-magnetic lost powder that is discharged without being trapped by the trap part 100 may be trapped on the inner sidewall W2 of the body part 200. That is, the lost powder may be more effectively trapped by doubly trapping the lost powder.

The body part 200 may include a main body 240, a first cover 241, and a second cover 242. The main body 240 may extend in a predetermined direction and may have the interior space 230 that is open at opposite ends. As illustrated in FIG. 1, the first cover 241 may be coupled to the main body 240 so as to cover an opening on one side of the main body 240. As illustrated in FIG. 1, the second cover 242 may be coupled to the main body 240 so as to cover an opening on an opposite side of the main body 240. The first cover 241 and the second cover 242 may be removable from the main body 240. The lost powder trapped by the trap part 100 may be accumulated in the main body 240, and the accumulated lost powder may be frequently removed by opening the first cover 241 and the second cover 242. Due to this, there is an effect of preventing a decrease in efficiency in trapping the lost powder by the trap part 100.

The inlet 210 and the outlet 220 may be formed in the first cover 241, and the trap part 100 extending toward the first cover 241 may be disposed on the second cover 242. For example, as illustrated in FIG. 2, the inlet 210 and the outlet 220 may be formed in the first cover 241 located on an upper side with respect to FIG. 2, and the trap part 100 on the second cover 242 located on a lower side with respect to FIG. 2 may extend toward the first cover 241 located on the upper side.

Embodiment 2

Figure 8:
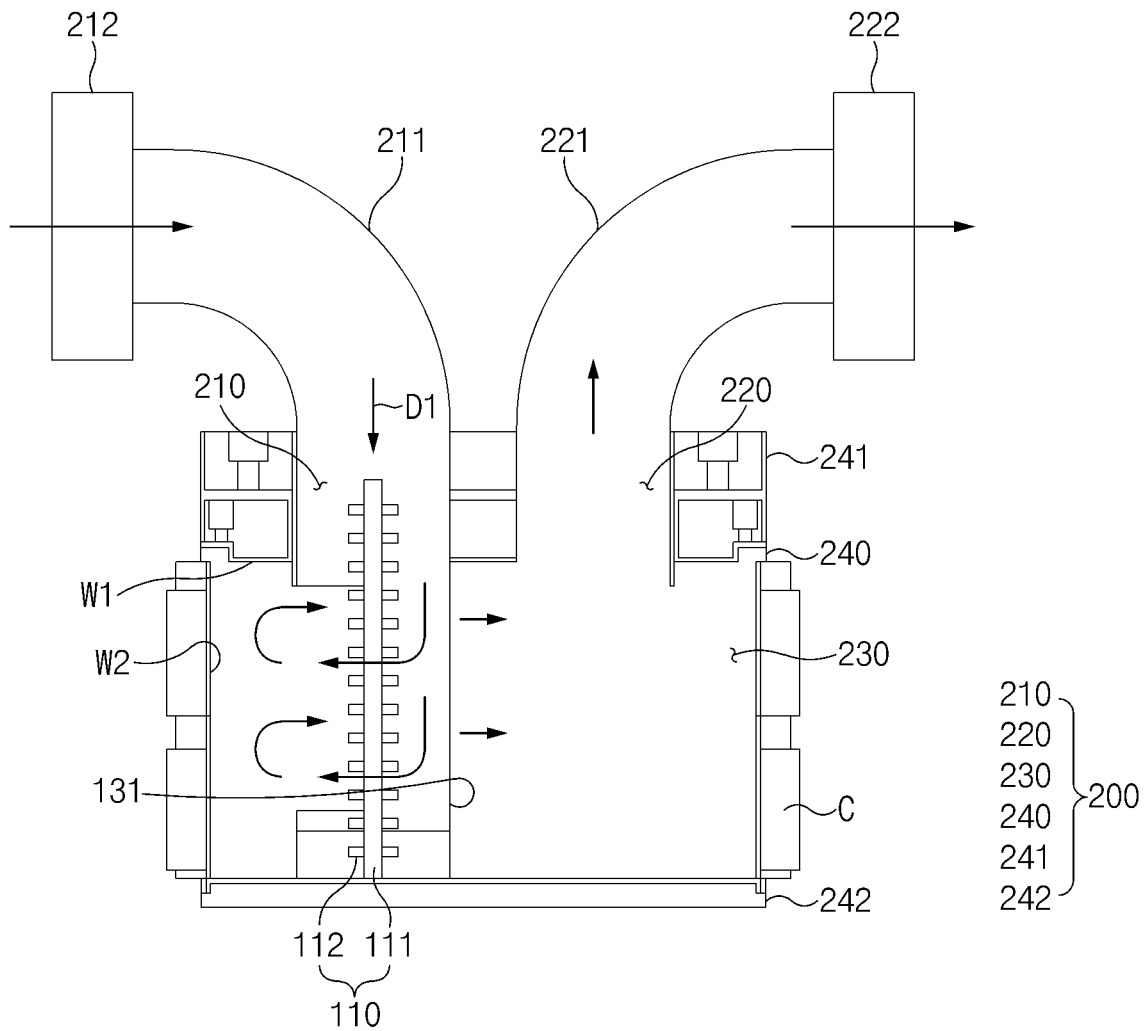
FIG. 8 is a sectional view illustrating a trap device for a powder coating apparatus according to embodiment 2 of the present disclosure.
Figure 9:
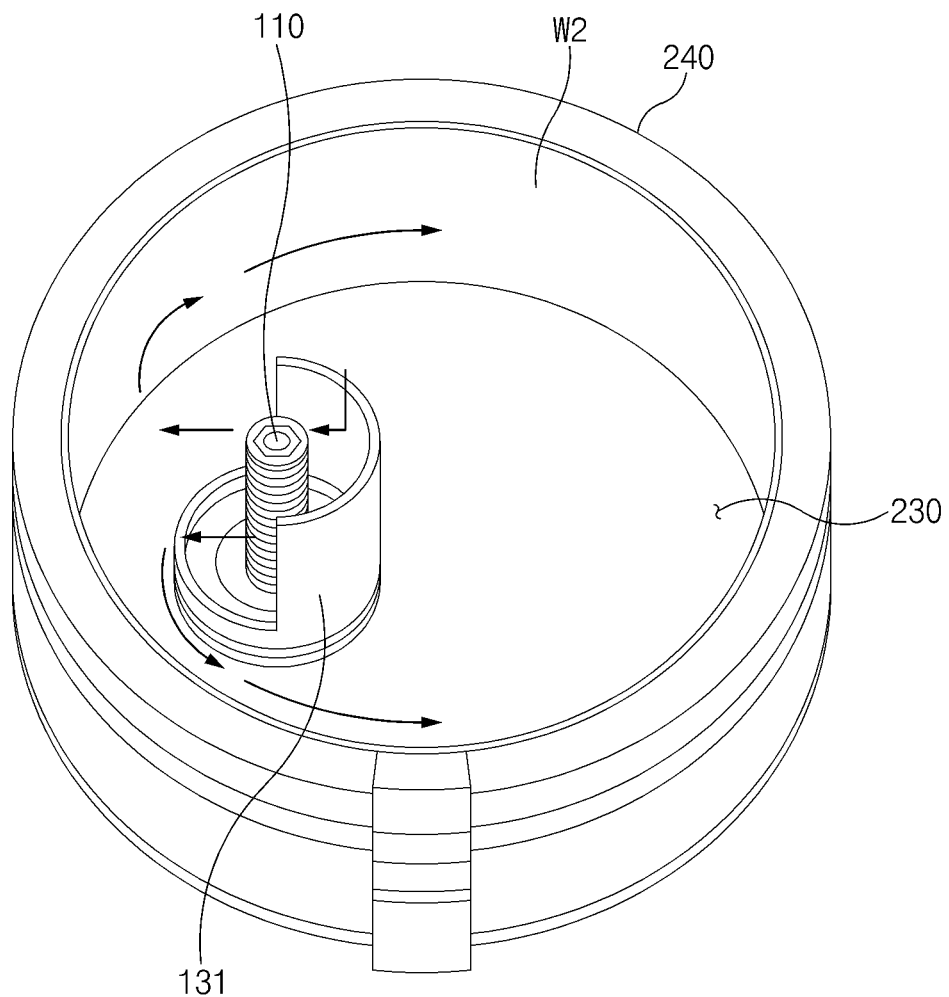
FIG. 9 is a perspective view illustrating the inside of the trap device for the powder coating apparatus of FIG. 8.

FIG. 8 is a sectional view illustrating a trap device for a powder coating apparatus according to embodiment 2 of the present disclosure. FIG. 9 is a perspective view illustrating the inside of the trap device for the powder coating apparatus of FIG. 8. Hereinafter, the trap device according to embodiment 2 of the present disclosure will be described with reference to FIGS. 8 and 9. The trap device according to embodiment 2 differs from the trap device according to embodiment 1 in terms of the trap part. Components identical to or corresponding to the components of the trap device according to embodiment 1 are denoted by identical or corresponding reference numerals, and specific descriptions thereabout are omitted.

As illustrated in FIGS. 8 and 9, the trap device according to embodiment 2 of the present disclosure may include a first trap part 110 and a first partition wall 131. The first trap part 110 may be disposed adjacent to an inlet 210 and may trap lost powder contained in exhaust gas, which is introduced through the inlet 210, by a magnetic force.

The first partition wall 131 may surround the first trap part 110. The first partition wall 131 may be open in a direction toward the inlet 210 and may be open in a direction away from an outlet 220. As illustrated in FIG. 9, the first partition wall 131 may have a cross-section in a semicircular arc shape. When the exhaust gas introduced through the inlet 210 collides with the first partition wall 131 having an arc-shaped cross-section, the exhaust gas may be guided by the shape of the first partition wall 131 so as to flow toward the first trap part 110. Accordingly, the amount of the exhaust gas making contact with the first trap part 110 may be increased, and thus efficiency in trapping the lost powder by the first trap part 110 may be increased.

Figure 10:
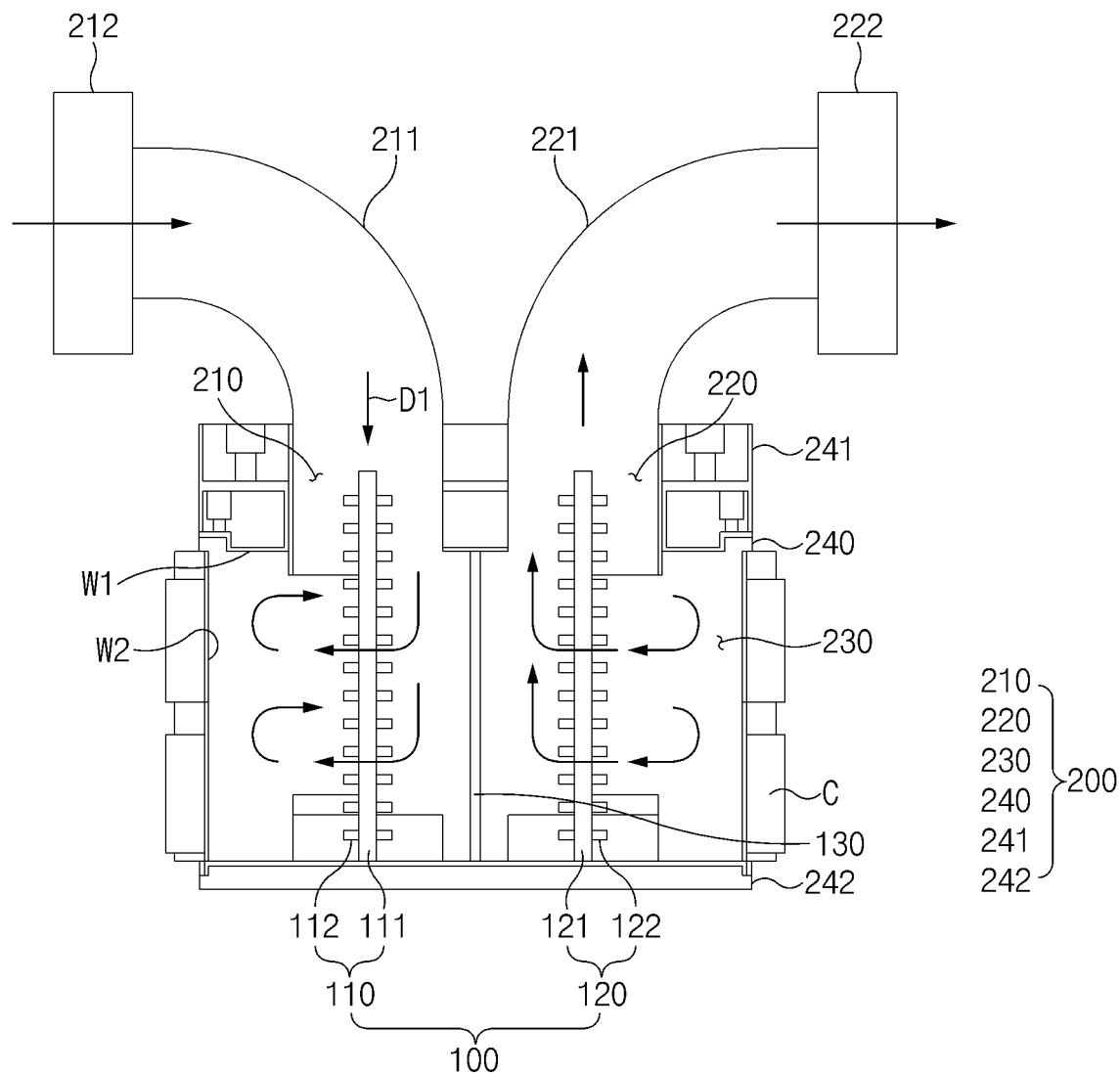
FIG. 10 is a sectional view illustrating a first modified example of the trap device for the powder coating apparatus of FIG. 8.
Figure 11:
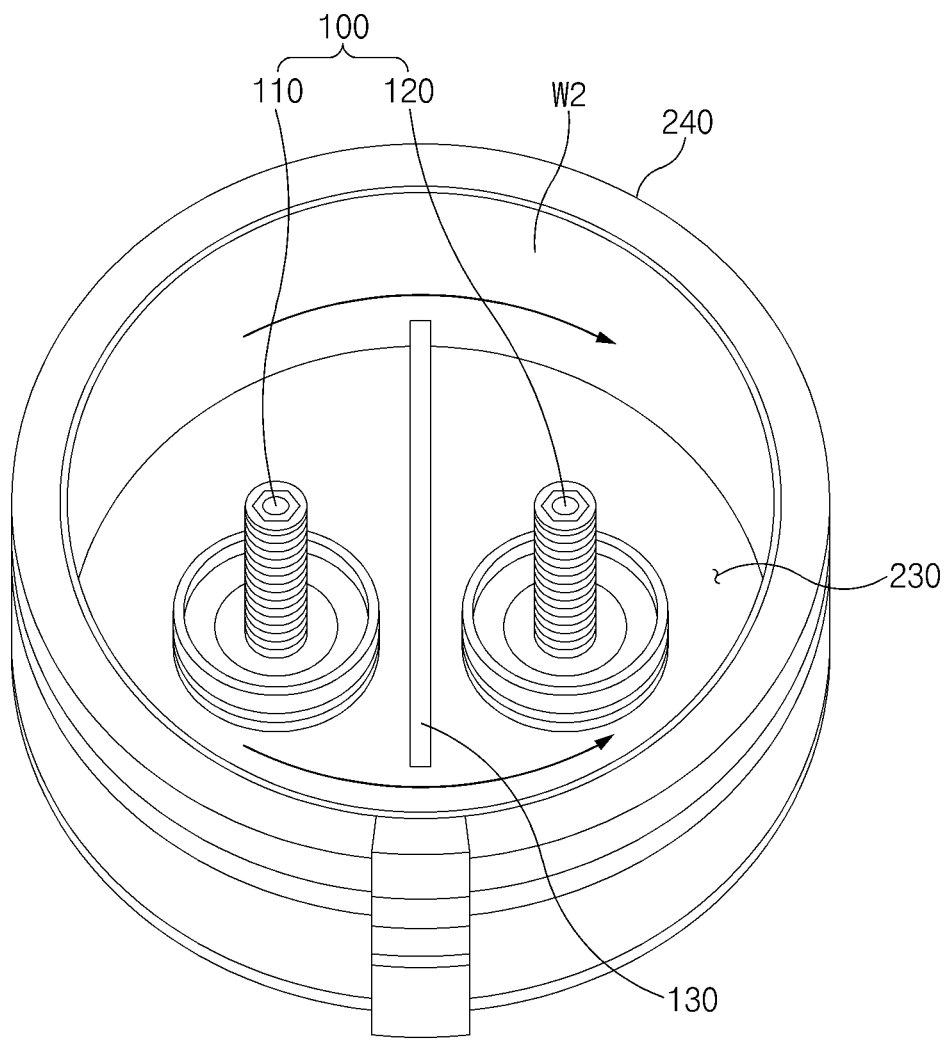
FIG. 11 is a perspective view illustrating the inside of the trap device for the powder coating apparatus of FIG. 10.

As illustrated in FIGS. 10 and 11, a trap part according to a first modified example of embodiment 2 of the present disclosure may include a first partition wall 130 disposed between a first trap part 110 and a second trap part 120. FIG. 10 is a sectional view illustrating the first modified example of the trap device for the powder coating apparatus of FIG. 8. FIG. 11 is a perspective view illustrating the inside of the trap device for the powder coating apparatus of FIG. 10.

The first partition wall 130 may be disposed between the first trap part 110 and the second trap part 120 and may guide exhaust gas, which is introduced through an inlet 210, in a direction away from an outlet 220. As illustrated in FIGS. 10 and 11, the first partition wall 130 may be a wall in the form of a straight line that is perpendicular to a straight line connecting the first trap part 110 and the second trap part 120. The path along which the exhaust gas moves from the inlet 210 to the outlet 220 may be lengthened by the first partition wall 130, and therefore the amount of the exhaust gas that makes contact with the first trap part 110 and the second trap part 120 may be increased. Accordingly, the first trap part 110 and the second trap part 120 may trap a larger amount of lost powder.

Figure 12:
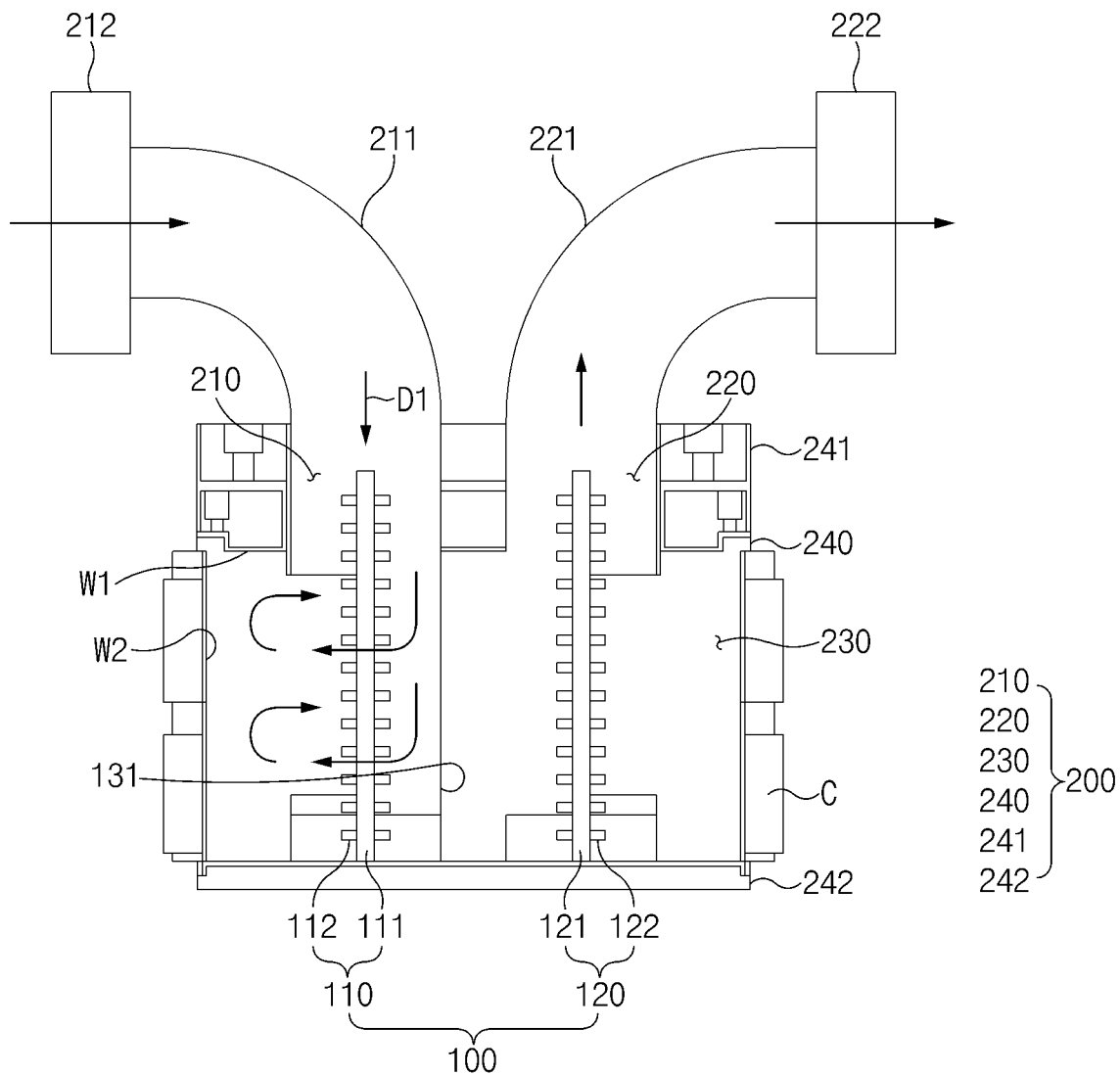
FIG. 12 is a sectional view illustrating a second modified example of the trap device for the powder coating apparatus of FIG. 8.
Figure 13:
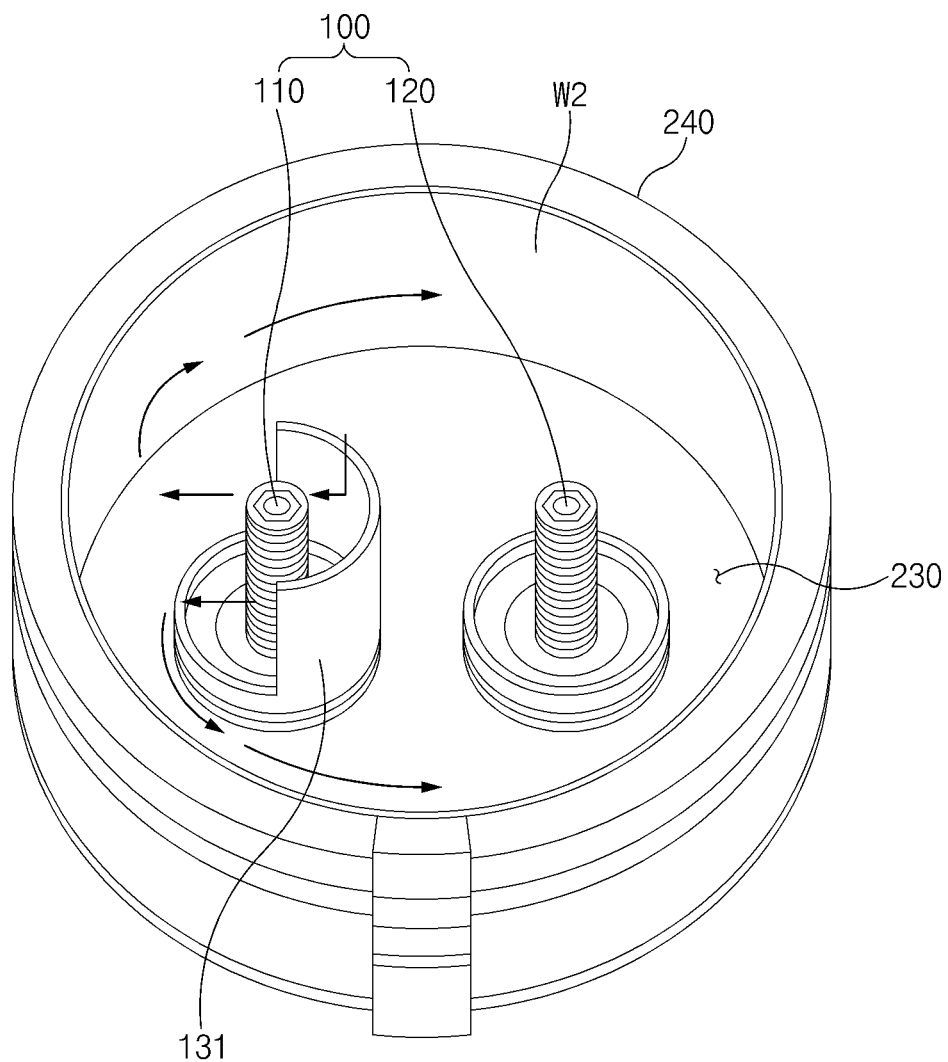
FIG. 13 is a perspective view illustrating the inside of the trap device for the powder coating apparatus of FIG. 12.

As illustrated in FIGS. 12 and 13, a trap part according to a second modified example of embodiment 2 of the present disclosure may include a first partition wall 131 that is disposed between a first trap part 110 and a second trap part 120 and that surrounds the first trap part 110. FIG. 12 is a sectional view illustrating the second modified example of the trap device for the powder coating apparatus of FIG. 8. FIG. 13 is a perspective view illustrating the inside of the trap device for the powder coating apparatus of FIG. 12.

The first partition wall 131 may have a cross-section in an arc shape that is open in a direction in which exhaust gas is guided. The first partition wall 131 may extend in a direction corresponding to the extension direction of the first trap part 110. As illustrated in FIG. 13, the first partition wall 131 may have a cross-section in a semicircular arc shape. When the exhaust gas introduced through the inlet 210 collides with the first partition wall 131 having an arc-shaped cross-section, the exhaust gas may be guided by the shape of the first partition wall 131 so as to flow toward the first trap part 110. Accordingly, the amount of the exhaust gas making contact with the first trap part 110 may be increased, and thus efficiency in trapping lost powder by the first trap part 110 may be increased.

The first partition wall 131 may extend to an upper inner wall W1 of a body part 200 in which the inlet 210 is formed, and may surround the inlet 210. For example, as illustrated in FIG. 12, the first partition wall 131 may meet the upper inner wall W1. In this case, the exhaust gas flowing toward the outlet 220 from the inlet 210 may not directly move to the right with respect to FIG. 12. The exhaust gas may flow to the left and thereafter to the right and may be discharged through the outlet 220. The exhaust gas directly discharged through the outlet 220 without being stopped by the partition wall may be interrupted by this shape. That is, efficiency in trapping the lost powder by the first trap part 110 may be increased by allowing all exhaust gas to pass the first trap part 110.

Figure 14:
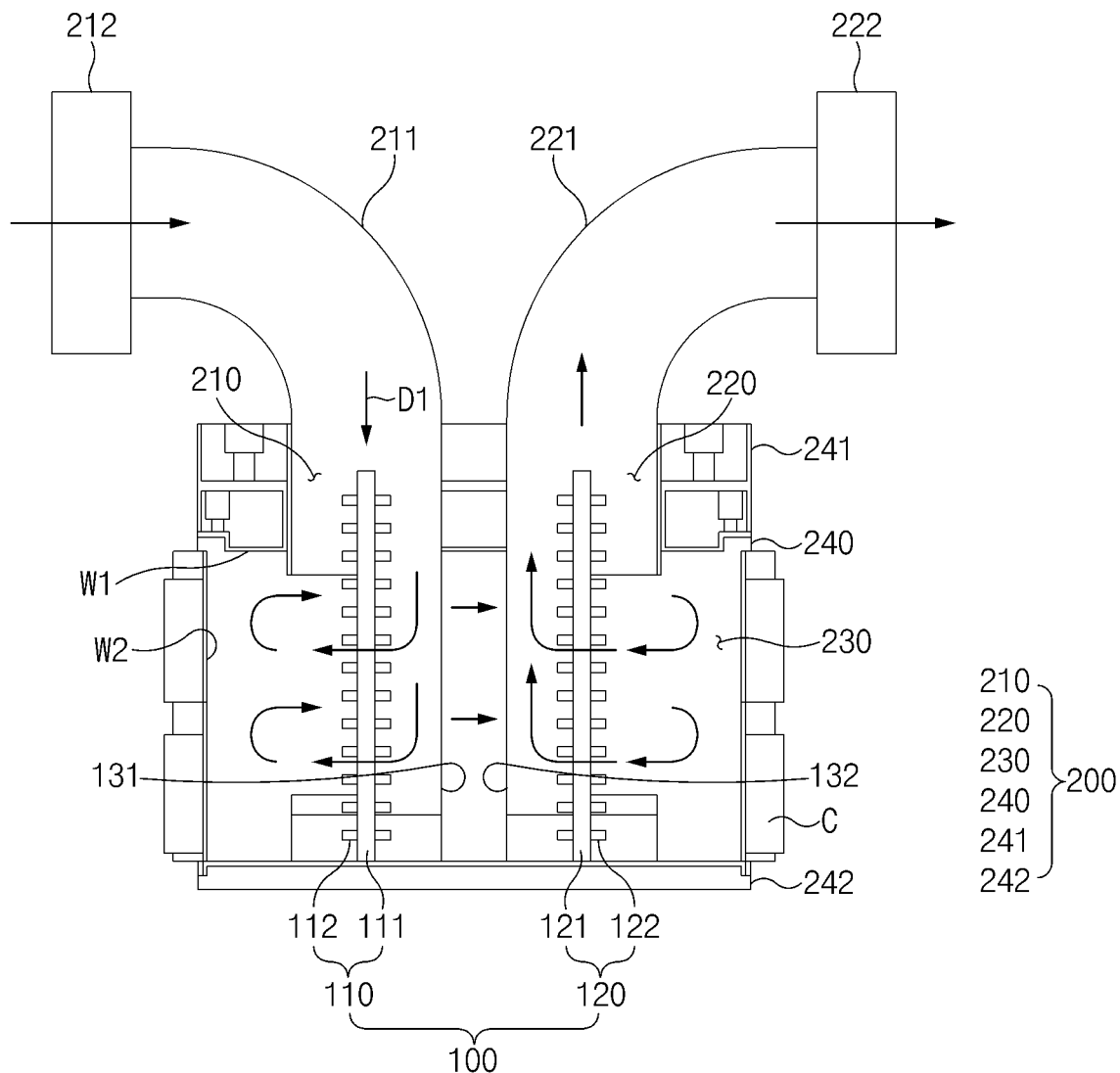
FIG. 14 is a sectional view illustrating a third modified example of the trap device for the powder coating apparatus of FIG. 8.
Figure 15:
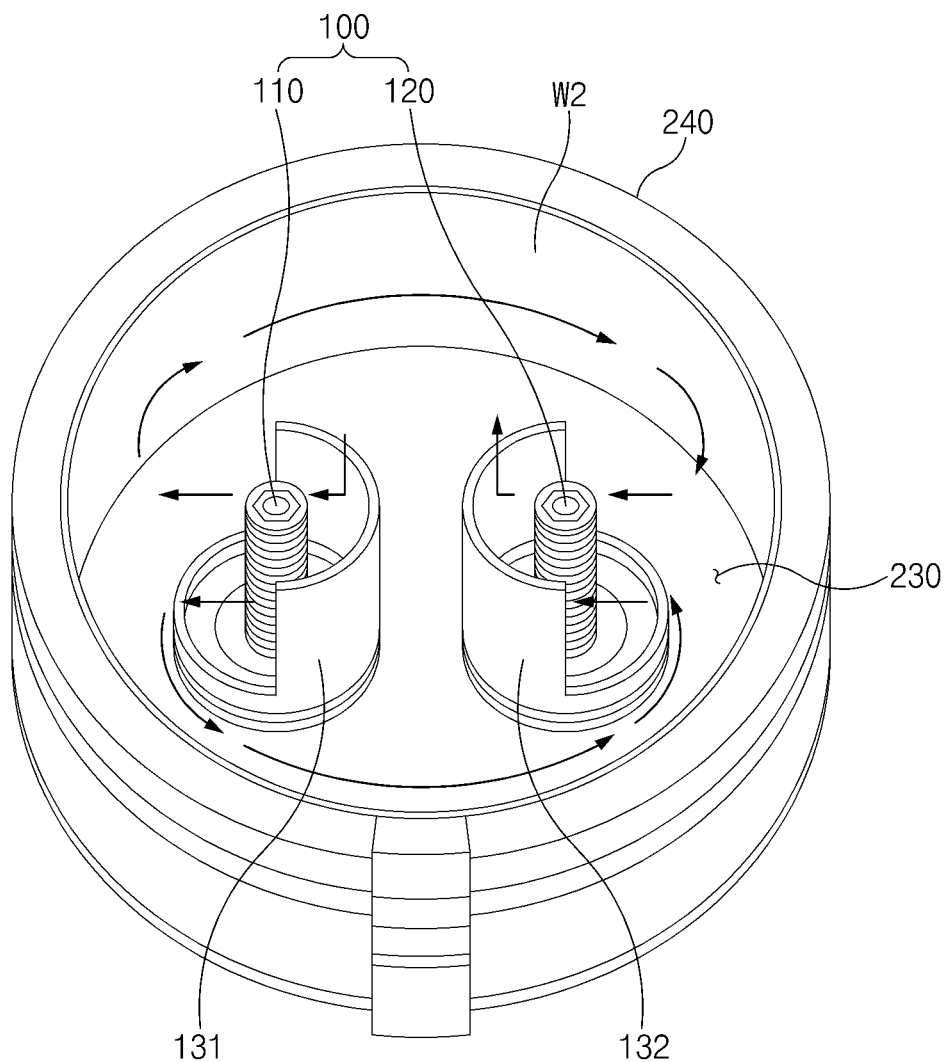
FIG. 15 is a perspective view illustrating the inside of the trap device for the powder coating apparatus of FIG. 14.

A trap part according to a third modified example of embodiment 2 of the present disclosure may further include a second partition wall 132. FIG. 14 is a sectional view illustrating the third modified example of the trap device for the powder coating apparatus of FIG. 8. FIG. 15 is a perspective view illustrating the inside of the trap device for the powder coating apparatus of FIG. 14. As illustrated in FIGS. 14 and 15, the second partition wall 132 may be disposed between a first partition wall 131 and a second trap part 120 and may guide exhaust gas toward an outlet 120. The second partition wall 132 may be a wall in the form of a straight line, like the first partition wall 130 illustrated in FIGS. 10 and 11. The second partition wall 132 may lengthen the path along which the exhaust gas moves to the outlet 220, and the exhaust gas may pass the second trap part 120. Accordingly, efficiency in trapping lost powder by the second trap part 120 may be increased.

The second partition wall 132 may be disposed to surround the second trap part 120. As illustrated in FIG. 15, the second partition wall 132 may have a cross-section in an arc shape that is open in a direction opposite to the direction in which the first partition wall 131 is open, and may extend in a direction corresponding to the extension direction of the second trap part 120. When the exhaust gas to be discharged through the outlet 220 collides with the second partition wall 132, the exhaust gas may be guided by the shape of the second partition wall 132 so as to flow toward the second trap part 120. Accordingly, the amount of the exhaust gas making contact with the second trap part 120 may be increased, and thus the efficiency in trapping the lost powder by the second trap part 120 may be increased.

Embodiment 3

Figure 16:
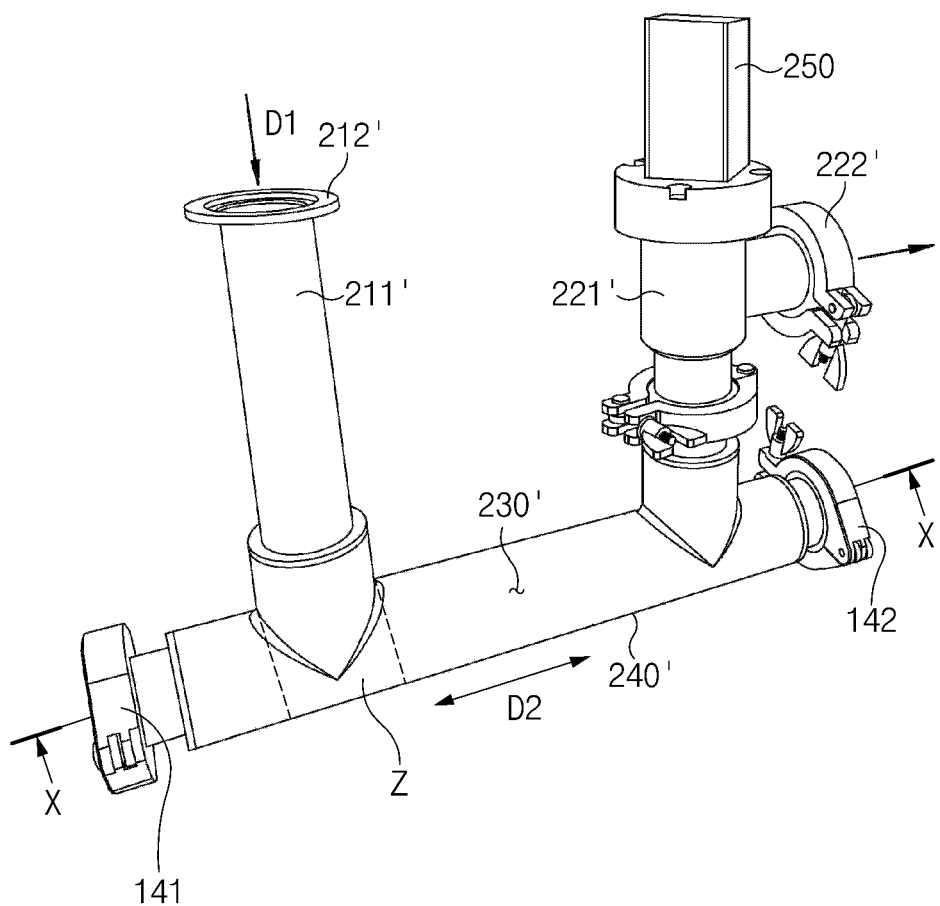
FIG. 16 is a perspective view illustrating a trap device for a powder coating apparatus according to embodiment 3 of the present disclosure.
Figure 17:
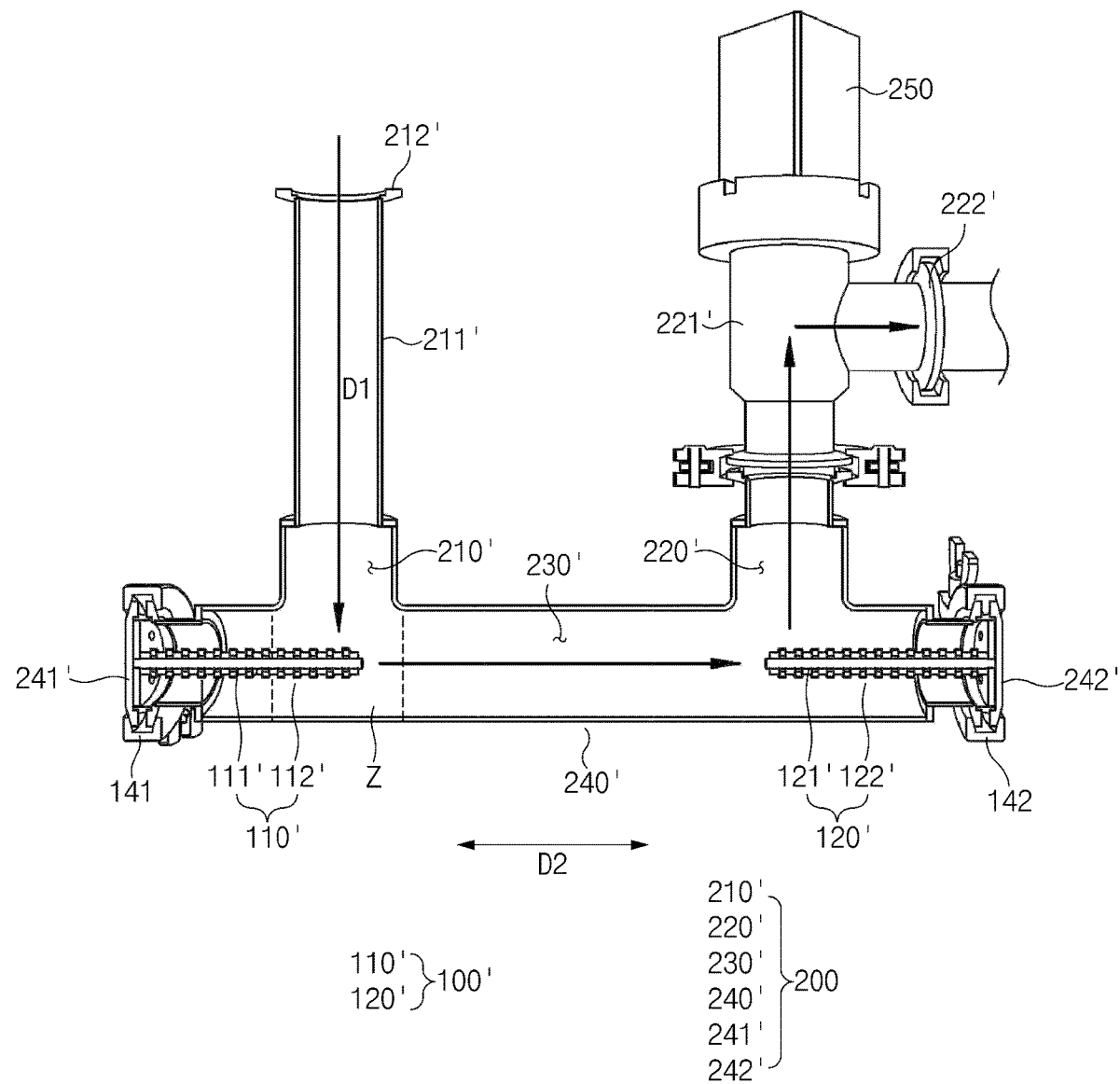
FIG. 17 is a sectional view taken along line X-X of FIG. 16.

FIG. 16 is a perspective view illustrating a trap device according to embodiment 3 of the present disclosure. FIG. 17 is a sectional view taken along line X-X of FIG. 16. Hereinafter, the trap device according to embodiment 3 of the present disclosure will be described with reference to FIGS. 16 and 17. The trap device according to embodiment 3 differs from the trap device according to embodiment 1 in terms of the body part. Components identical to or corresponding to the components of the trap device according to embodiment 1 are denoted by identical or corresponding reference numerals, and specific descriptions thereabout are omitted.

A trap part 100' of the trap device for the powder coating apparatus according to embodiment 3 of the present disclosure may be disposed to overlap a projection area Z that will be described below. As illustrated in FIG. 17, the projection area Z is an overlapping area between an area when an inlet 210' is projected in a reference direction D1 in which exhaust gas is introduced into an interior space 230' of a body part 200' through the inlet 210' and an area extending in a direction perpendicular to the reference direction D1. For example, as illustrated in FIG. 17, a first trap part 110' may extend perpendicular to the reference direction D1 and may be disposed such that at least part thereof overlaps the projection area Z. Because the exhaust gas introduced through the inlet 210' passes through the projection area Z, the exhaust gas introduced through the inlet 210' may easily meet the trap part 100' when at least part of the trap part 100' is disposed in the projection area Z. Due to this, the amount of the exhaust gas making contact with the trap part 100' may be increased, and thus efficiency in trapping lost powder by the trap part 100' may be increased.

As illustrated in FIG. 17, the trap part 100' may include the first trap part 110' disposed on a first cover 241' and a second trap part 120' disposed on a second cover 242'. As illustrated in FIG. 17, the first trap part 110' may extend toward the second cover 242' and may trap the lost powder contained in the exhaust gas, which is introduced through the inlet 210', by a magnetic force. The second trap part 120' may be disposed on the second cover 242' and may extend toward the first cover 241'. The second trap part 120' may trap the lost powder contained in the exhaust has, which is to be discharged through an outlet 220', by a magnetic force.

As illustrated in FIG. 17, the inlet 210' and the outlet 220' may be formed in a main body 240'. The inlet 210' and the outlet 220' may be in communication with the interior space 230' in a direction perpendicular to a direction D2 in which the interior space 230' extends. The inlet 210' and the outlet 220' may be adjacent to the first trap part 110' and the second trap part 120', respectively.

As illustrated in FIG. 17, the first cover 241' may be coupled with the main body 240' by clamps 141 and 142. However, the coupling method is not limited to the clamps 141 and 142, and various coupling methods such as fastening through a bolt and a nut and fastening through a magnetic force may be used. Because the first cover 241' is coupled by the clamps 141 and 142, the cover may be simply assembled and disassembled, and thus manufacturing cost may be reduced.

The first trap part 110' may be fixed to the first cover 241'. Because the first trap part 110' is fixed to the first cover 241', the first trap part 110', together with the first cover 241', may be separated from or coupled to the main body 20' when the first cover 241' is separated from or coupled to the main body 240'. For example, as illustrated in FIG. 17, the first trap part 110' may be coupled to one surface of the first cover 241' that is coupled to the main body 240' by the clamps 141 and 142. Because the first trap part 110' is fixed to the first cover 241', the first trap part 110', together with the first cover 241', may be separated from the main body 240' when the first cover 241' is separated from the main body 240'. In this case, the first trap part 110' may be easily separated from the main body 240', and thus the lost powder trapped on the first trap part 110' may be easily removed. Accordingly, efficiency in trapping the lost powder by the trap part may be increased by separating, from the main body 240', the trap part having sufficiently trapped the lost powder, removing the lost powder, coupling the trap part to the main body 240' again, and allowing the trap part to trap lost powder.

In the trap device for the powder coating apparatus, an isolation valve 250 for opening and closing the outlet 220' may be connected to an outlet connecting conduit 221'. The isolation valve 250 may be a kind of gate valve that is capable of performing an isolation process between a pump and a chamber. For example, as illustrated in FIG. 16, the isolation valve 250 may be connected to one side of the outlet connecting conduit 221' and may maintain the outlet 220' in an open or closed state. Accordingly, the emission of the exhaust gas may be controlled, and the lost powder may be prevented from being accumulated in the isolation valve 250 to cause a problem in an opening/closing function.

According to the present disclosure, the trap device may trap fine powder particles lost from a powder coating chamber by a magnetic force. Accordingly, the trap device may prevent damage to a pump by blocking magnetic powder particles before the magnetic powder particles are introduced into the pump, may increase the life-time of the pump by preventing accumulation of the powder, may maintain process characteristics by maintaining the performance of the pump, and may reduce repair costs by maximally increasing a pump repair period.

In addition, according to the present disclosure, the trap device may have a simple structure. Accordingly, manufacturing costs of the trap device may be reduced, and accumulated powder may be easily removed.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, the exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

What is claimed is:

1. A trap device for a powder coating apparatus, the trap device comprising:
    a body part including an inlet through which exhaust gas containing lost powder is introduced, an outlet through which the exhaust gas is discharged, and an interior space in communication with the inlet and the outlet; and a trap part located in the interior space of the body part and configured to trap the lost powder contained in the exhaust gas by a magnetic force;

wherein the trap part includes:
- a first trap part disposed adjacent to the inlet and configured to trap the lost powder contained in the exhaust gas, which is introduced through the inlet, by a magnetic force; and
- a second trap part disposed adjacent to the outlet and configured to trap the lost powder contained in the exhaust gas, which is to be discharged through the outlet, by a magnetic force.

2. The trap device of claim 1, wherein the trap part further includes:
- a first partition wall disposed between the first trap part and the second trap part and configured to guide the exhaust gas, which is introduced through the inlet, in a direction away from the outlet.

3. The trap device of claim 2, wherein the first partition wall has a cross-section in an arc shape that is open in the direction in which the exhaust gas is guided, and the first partition wall extends in a direction corresponding to an extension direction of the first trap part and is disposed to surround the first trap part.

4. The trap device of claim 3, wherein the first partition wall extends to an upper inner wall of the body part in which the inlet is formed, and is disposed to surround the inlet.

5. The trap device of claim 2, wherein the trap part further includes:
- a second partition wall disposed between the first partition wall and the second trap part and configured to guide the exhaust gas toward the outlet.

6. The trap device of claim 5, wherein the second partition wall has a cross-section in an arc shape that is open in an opposite direction to a direction in which the first partition wall is open, and the second partition wall extends in a direction corresponding to an extension direction of the second trap part and is disposed to surround the second trap part.

7. The trap device of claim 1, wherein when a direction in which the exhaust gas is introduced into the interior space of the body part through the inlet is referred to as a reference direction, the trap part extends in the reference direction, and a distal end of the trap part in an opposite direction to the reference direction faces toward the inlet.

8. The trap device of claim 1, wherein when a direction in which the exhaust gas is introduced into the interior space of the body part through the inlet is referred to as a reference direction, the trap part extends in a direction perpendicular to the reference direction and is disposed to overlap a projection area when the inlet is projected in the reference direction.

9. The trap device of claim 8, wherein an isolation valve configured to open and close the outlet is connected to the outlet.

10. A trap device for a powder coating apparatus, the trap device comprising:
- a body part including an inlet through which exhaust gas containing lost powder is introduced, an outlet through which the exhaust gas is discharged, and an interior space in communication with the inlet and the outlet; and
- a trap part located in the interior space of the body part and configured to trap the lost powder contained in the exhaust gas by a magnetic force;

wherein the trap part includes a trap column extending in a predetermined direction and a trap wing extending in a direction away from the trap column and coupled to the trap column, and wherein at least one of the trap column and the trap wing traps the lost powder by a magnetic force.

11. A trap device for a powder coating apparatus, the trap device comprising:
- a body part including an inlet through which exhaust gas containing lost powder is introduced, an outlet through which the exhaust gas is discharged, and an interior space in communication with the inlet and the outlet; and
- a trap part located in the interior space of the body part and configured to trap the lost powder contained in the exhaust gas by a magnetic force; and
- a cooling part configured to cool an inner sidewall of the body part to condense and trap, on the inner sidewall, non-magnetic lost powder contained in the lost powder.

12. A trap device for a powder coating apparatus, the trap device comprising:
- a body part including an inlet through which exhaust gas containing lost powder is introduced, an outlet through which the exhaust gas is discharged, and an interior space in communication with the inlet and the outlet; and
- a trap part located in the interior space of the body part and configured to trap the lost powder contained in the exhaust gas by a magnetic force;

wherein the body part includes:
- a main body extending in a predetermined direction and having the interior space that is open at opposite ends;
- a first cover coupled to the main body to cover one opening of the main body; and
- a second cover coupled to the main body to cover an opposite opening of the main body.

13. The trap device of claim 12, wherein the inlet and the outlet are formed in the first cover, and wherein the trap part extending toward the first cover is disposed on the second cover.

14. The trap device of claim 12, wherein the trap part includes:
- a first trap part disposed on the first cover and extending toward the second cover, the first trap part being configured to trap the lost powder contained in the exhaust gas, which is introduced through the inlet, by the magnetic force; and
- a second trap part disposed on the second cover and extending toward the first cover, the second trap part being configured to trap the lost powder contained in the exhaust gas, which is to be discharged through the outlet, by the magnetic force, and wherein the inlet and the outlet are formed in the main body such that the inlet and the outlet are in communication with the interior space in a direction perpendicular to an extension direction of the interior space and are adjacent to the first trap part and the second trap part.

15. The trap device of claim 12, wherein the first cover is coupled with the main body by a clamp.

16. The trap device of claim 15, wherein the first trap part is fixed to the first cover and is separated from or coupled to the main body together with the first cover when the first cover is separated from or coupled to the main body.

* * * * *